United States Patent [19]
Drobny et al.

[11] Patent Number: 6,080,644
[45] Date of Patent: Jun. 27, 2000

[54] COMPLEMENTARY BIPOLAR/CMOS EPITAXIAL STRUCTURE AND PROCESS

[75] Inventors: Vladimir F. Drobny; Kevin X. Bao, both of Tucson, Ariz.

[73] Assignee: Burr-Brown Corporation, Tucson, Ariz.

[21] Appl. No.: 09/149,353

[22] Filed: Sep. 8, 1998

Related U.S. Application Data

[60] Provisional application No. 60/073,883, Feb. 6, 1998.

[51] Int. Cl.$^7$ ................................................ H01L 21/20
[52] U.S. Cl. ........................ 438/507; 438/510; 438/607
[58] Field of Search ................................ 438/478, 479, 438/481, 607, 503, 507, 510, 542, 543, 565; 257/929; 117/105

[56] References Cited

U.S. PATENT DOCUMENTS

| | | | |
|---|---|---|---|
| 4,153,486 | 5/1979 | Srinivasan | 148/175 |
| 4,696,701 | 9/1987 | Sullivan | 148/33.5 |
| 4,859,626 | 8/1989 | Wise | 437/81 |
| 5,162,256 | 11/1992 | Jurgensen | 437/110 |
| 5,168,089 | 12/1992 | Feygenson et al. | 437/89 |
| 5,225,359 | 7/1993 | DeLong | 437/39 |
| 5,227,328 | 7/1993 | Khan et al. | 437/82 |
| 5,256,887 | 10/1993 | Yang | 257/53 |
| 5,279,987 | 1/1994 | Lechaton et al. | 437/95 |
| 5,324,685 | 6/1994 | Hirtz et al. | 437/95 |
| 5,329,150 | 7/1994 | Schubert et al. | 257/458 |
| 5,347,161 | 9/1994 | Wu et al. | 257/756 |
| 5,378,651 | 1/1995 | Agnello et al. | 437/106 |
| 5,391,515 | 2/1995 | Kao et al. | 437/133 |
| 5,420,058 | 5/1995 | Lee et al. | 437/41 |
| 5,431,707 | 7/1995 | Dick et al. | 65/60.5 |
| 5,432,121 | 7/1995 | Chan et al. | 437/95 |
| 5,691,226 | 11/1997 | Foerstner et al. | 437/59 |

*Primary Examiner*—John F. Niebling
*Assistant Examiner*—Christopher Lattin
*Attorney, Agent, or Firm*—Cahill, Sutton & Thomas P.L.C.

[57] ABSTRACT

An epitaxial layer is formed on a P type silicon substrate in which a plurality of P+ buried layer regions, a plurality of N+ buried layer regions, and a P+ field layer region occupying most of the substrate surface are diffused. The substrate is loaded in a reactor with a carrier gas. The substrate is pre-baked at a temperature of approximately 850° C. As the substrate is heated to a temperature of 1050° C. N+ dopant gas is injected into the carrier gas to suppress autodoping due to P+ atoms that escape from the P+ buried layer regions. The substrate is subjected to a high temperature bake cycle in the presence of the N+ dopant gas. A first thin intrinsic epitaxial cap layer is deposited on the substrate, which then is subjected to a high temperature gas purge cycle at 1080° C. A second thin intrinsic epitaxial cap layer then is deposited on the first, and a second high temperature gas purge cycle is performed at 1080° C. Then an N- epitaxial layer is deposited on the second cap layer at 1080° C. The harmful effects of a dip in the dopant concentration profile at the bottoms of the collectors of the NPN transistors are avoided by the process.

14 Claims, 4 Drawing Sheets

PNP COLLECTOR REGION FOR STANDARD EPI PROCESS AFTER FIELD OXIDATION

NPN COLLECTOR REGION FOR STANDARD EPI PROCESS AFTER FIELD OXIDATION

DOPING PROFILE ON NPN COLLECTOR FOR EPI GROWN USING THE NOVEL N-TYPE DOPED PRE-BAKE CYCLE.

DOPING PROFILE OF PNP COLLECTOR FOR EPI GROWN USING THE NOVEL N-TYPE DOPED PRE-BAKE CYCLE.

COMPLEMENTARY BIPOLAR/CMOS EPITAXIAL STRUCTURE AND PROCESS

CROSS REFERENCE TO RELATED APPLICATION

This application claims the benefit of prior filed co-pending U.S. Provisional Application Ser. No. 60/073,883, filed Feb. 6, 1998, entitled "ENGINEERED EPI FOR HIGH SPEED CBCMOS TECHNOLOGY" by Vladimir F. Drobny and Kevin Bao.

BACKGROUND OF THE INVENTION

The invention relates to a high speed complementary bipolar/CMOS process that provides a doping profile in the collectors of NPN transistors formed in an epitaxial layer so as to avoid a "dip" in N type dopant concentration, which dip causes slow speed and other undesirable properties of the NPN transistors.

Those skilled in the art know that it is difficult to provide a process for manufacturing an epitaxial silicon layer that is satisfactory for use in a high speed complementary bipolar/CMOS process. In such a process a very thin, lightly doped N type epitaxial silicon layer must be grown on a silicon wafer including both pre-formed P+ boron doped buried layers and N+ arsenic doped buried layers formed in a P− substrate. In a typical prior art complementary bipolar/CMOS process the epitaxial layer is doped lightly in situ with arsenic to a concentration of approximately $2 \times 10^{15}$ $cm^{-3}$ to achieve an optimal combination of characteristics of NPN, PNP and CMOS transistors to be formed. After the epitaxial deposition, the collector regions of the PNP and NPN transistors and the CMOS "wells" are further doped by a combination of low energy and high energy boron or phosphorous implants, with energies and doses tailored to the needs of various "families" of devices. During conventional epitaxial growth and subsequent conventional thermal processing, both the P type buried layers and the N type buried layers updiffuse into the epitaxial layer. That reduces the thickness of the useful portions of the collector regions for the transistors being fabricated. Since the P+ and N+ buried layers diffuse at significantly different rates, the PNP transistors end up having shallower collectors than the NPN transistor.

Since the diffusion of a P+ buried layer accelerates more rapidly than an N+ layer with respect to temperature, differences in the thicknesses of the collectors of the PNP transistors and the NPN transistors can be minimized by keeping the "Dt" of all high temperature process steps as low as possible. ("Dt" is a term referring to the cumulative amount of time that the wafer is subjected to high temperatures, usually exceeding 1000° C., after the epitaxial layer has been deposited.) The deep double implants used to form the collectors of the required depth for the NPN and PNP transistors, respectively, eliminate the need for high Dt diffusions after the formation of the epitaxial layer.

Note that a drawback associated with the large differential dopant diffusivity of arsenic buried layers and boron buried layers remains even for "low Dt processing". For very low Dt processes, achieving the desirable PNP collector often results in producing an undesirable lightly doped N type subregion where an NPN collector region meets the N+ buried layer.

Furthermore, the value of N− dopant in the epitaxial layer must be selected to achieve the best characteristics of both the PNP and NPN transistors. If the N− concentration is as high as would be desirable for the NPN collector regions, then it would be far too high for the collectors of the PNP transistors. Therefore, a lower N− epitaxial dopant level, indicated by numeral 14 in FIG. 2, is selected instead. Then an N type ion implantation is applied to the surface, raising the N type dopant concentration to a suitable level for the NPN collectors. Unfortunately, it is impractical to provide the dose and energies needed to produce the "flat" N type epitaxial dopant concentration profile at the bottoms of the NPN collector regions. Consequently, the failure of the implanted ions to reach the bottoms of the NPN collector regions is a partial cause of the "dip" 20 in FIG. 2.

The problem of such light doping is further aggravated by boron autodoping, wherein a large number of P type boron atoms escape from the large P+ buried layer area and then diffuse into the surface of the P− substrate and into the lightly doped N type epitaxial layer being grown, reducing or "compensating" its dopant concentration. This results in increased collector resistance and corresponding increased $V_{CE(sat)}$ voltage, reduced $f_T$ (i.e., the unity gain frequency or cutoff frequency), lower NPN switching speeds, and higher power dissipation.

FIGS. 1 and 2 show typical dopant concentration profiles for the PNP and NPN collector regions, respectively, made by a conventional complementary bipolar process after completion of a field oxidation step, during which most of the dopant diffusion occurs.

The dopant profiles of FIGS. 1 and 2 were obtained from a simulation of the dopant diffusions for the conventional epitaxial deposition process. The process simulation was calibrated to match experimental results measured from a substrate with a large percentage (for example 80%) of the wafer surface area implanted with a dose of approximately $1 \times 10^{15}$ $cm^{-2}$ of boron followed by a P+ buried layer diffusion. (As those skilled in the art will recognize, the reason the large percentage of the P+ wafer substrate area has P+ "buried layer material" therein is to reduce substrate resistance and increase latch-up immunity of bipolar transistors and CMOS transistors.)

The prior art epitaxial process referred to above includes a high temperature $H_2$ pre-bake followed by a high temperature purge and then by a 1.5 micron deposition of an epitaxial layer of lightly arsenic (N type); line 13 after "boron", insert (P+) doped single crystal silicon. The large amount of P+ surface area of the substrate causes a large amount of boron auto-doping into the lightly doped N type epitaxial layer being formed. The amount of corresponding boron autodoping in the dopant concentration profile of prior art FIGS. 1 and 2 was computed using simulated TSUPREM-4 profiles, and the simulated profiles were calibrated to match the measured experimental results. The TSUPREM-4 simulation program is a commercially available software package "Two-dimensional Process Simulation Program", sold by Avant! Corporation, formerly Technology Modeling Associates.

For thin epitaxial layers (e.g., less than two microns in thickness), the autodoping strongly influences the transistor collector dopant concentration profiles. The large P+ substrate surface area mentioned above contributes a significant amount of boron autodoping during the epitaxial growth, which aggravates the above-mentioned problems with the performance of the NPN transistors, further reduces the depth of the PNP collector regions, and increases the difference between the breakdown characteristics of NPN and PNP transistors. The standard flat dopant profile epitaxial process techniques used to generate the profiles in prior art FIGS. 1 and 2 are not able to correct these problems.

Referring to FIGS. 1 and 2, the dopant concentration profiles of the prior art NPN and PNP collector regions are noticeably different when a standard epitaxial process is used. The differences between the peak implant concentration depths (commonly referred to as Rp) for phosphorus and boron implants is another cause of the large difference in the dopant concentration profiles of the NPN and PNP collector regions when practical implant energies are used. This difference is further aggravated by the boron autodoping. The NPN collector region, doped by a combination of low and high energy implants, shows a significant dopant concentration dip at its bottom, indicated by reference arrows 20 in FIG. 1. This very lightly doped region adversely affects both the AC and DC performance of the NPN transistor by raising its collector region resistivity. This increases its collector resistance and thereby reduces $f_T$ and increases the collector-to-emitter saturation voltages of the NPN transistor.

Prior experimentation in forming arsenic doped N+ epitaxial caps in the hope of increasing the doping concentration at the bottoms of the NPN collector regions has failed to adequately compensate for the boron autodoping at the epitaxial/substrate interface.

Thus, there is a need for an improved epitaxial process for complementary bipolar/CMOS for providing bipolar transistors, especially NPN transistors, with more ideal collector profiles leading to lower collector resistances and higher values of $f_T$ than has been previously achievable.

SUMMARY OF THE INVENTION

Accordingly, it is an object of the invention to provide a high speed complementary bipolar/CMOS epitaxial process that provides NPN transistors in which undesirable effects of a dip or decrease in the N type collector dopant concentration profile close to an N+ buried layer are avoided.

It is another object of the invention to provide a high speed complementary bipolar/CMOS epitaxial process in which the NPN and PNP transistors have similar performance characteristics.

It is another object of the invention to provide a high speed complementary bipolar/CMOS process in which the NPN transistors have higher $f_T$ lower collector resistance, and lower collector-to-emitter saturation voltage than has been previously achievable.

It is another object of the invention to provide a high speed complementary bipolar/CMOS process with a very uniform collector dopant concentration profile which leads to a high cutoff frequency $f_T$ that is higher than previously has been achieved.

It is another object of the invention to provide a high speed complementary bipolar/CMOS process wherein process techniques that allow eliminating an undesirable dip in the dopant concentration profile of the collectors of the NPN transistors also allow optimization of the dopant concentration profile of the collectors of the PNP transistors.

Briefly described, and in accordance with one embodiment thereof, the invention provides a method of making an epitaxial layer on a P type silicon substrate having a P+ field layer region in most of a major surface of the substrate. The method includes loading the substrate in a reactor with a carrier gas therein, pre-baking the substrate, further heating the substrate, providing N+ dopant gas with the carrier gas, deoxidizing the substrate in the presence of the N+ dopant gas, depositing a first intrinsic epitaxial cap layer, performing a first bake cycle, depositing a second intrinsic epitaxial cap layer, performing a second bake cycle, and depositing an N- epitaxial layer having a thickness substantially greater than the thickness of either of the first and second cap layers. The process avoids an undesirable dip in the dopant concentration profile of the collector of PNP transistors formed in the epitaxial layer and results in higher $f_T$, lower $V_{SAT}$ devices.

DETAILED DESCRIPTION OF THE PREFERRED EMBODIMENTS

In accordance with the present invention, numerous experiments have been performed to evaluate effects of the durations and temperatures of pre-bake cycles and HCl cycles on the amount of released or "escaped" boron dopant atoms from the P+ regions in an P- substrate and the resulting P type autodoping of adjacent regions of the wafer. Intrinsic epitaxial "cap" layers and arsenic doped epitaxial cap layers were evaluated for their ability to reduce or suppress the P type autodoping and to increase the N type dopant concentration near the bottom of the NPN collectors. Low temperature purges and high temperature purges were evaluated with respect to their effectiveness in reducing the concentration of the undesired P type dopant during the epitaxial deposition.

As a result, the epitaxial growth cycle technique of the present invention was developed and was shown to reduce the amount of the previously mentioned "dip" 20 (FIG. 2) in the NPN collector doping profile by selectively providing N type dopant ions at depths deeper than achieved during an N type implantation process, and also suppressing the P type autodoping. The technique developed introduces dopant during the $H_2$ high temperature bake cycle. That is followed by deposition of an intrinsic epitaxial cap layer, followed by a high temperature gas purging cycle. This technique proved to be the most effective in reducing the amount of autodoping and correcting the above mentioned dip in the NPN collector profile doping to thereby provide the desired NPN collector dopant concentration profile.

Figure 1:
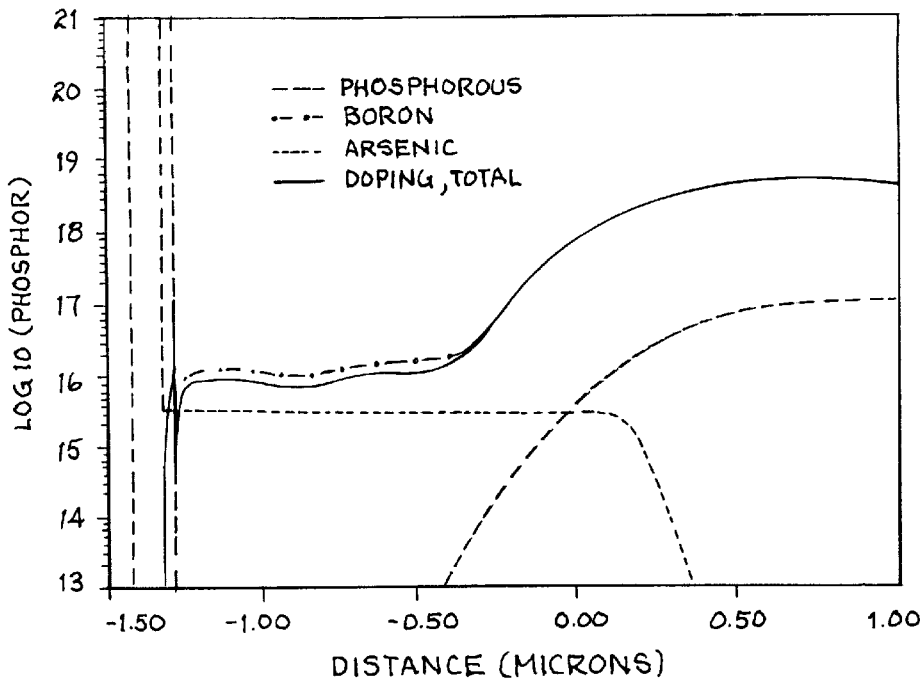
FIG. 1 is a doping profile of the collector region of a PNP transistor for a standard prior art epitaxial process.
Figure 4:
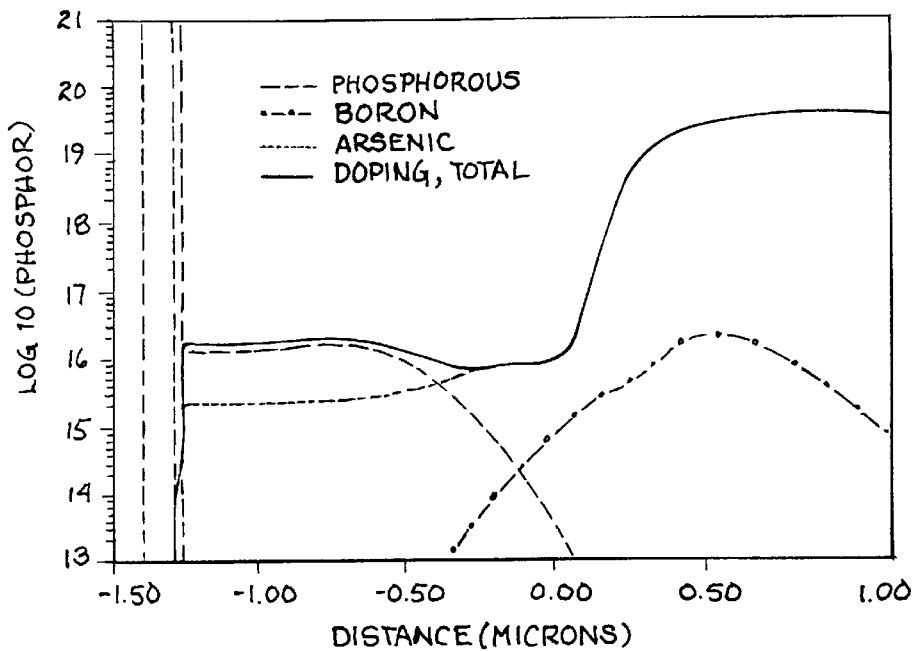
FIG. 4 is a doping profile of the collector region of an NPN transistor formed using the process of the present invention.
Figure 5:
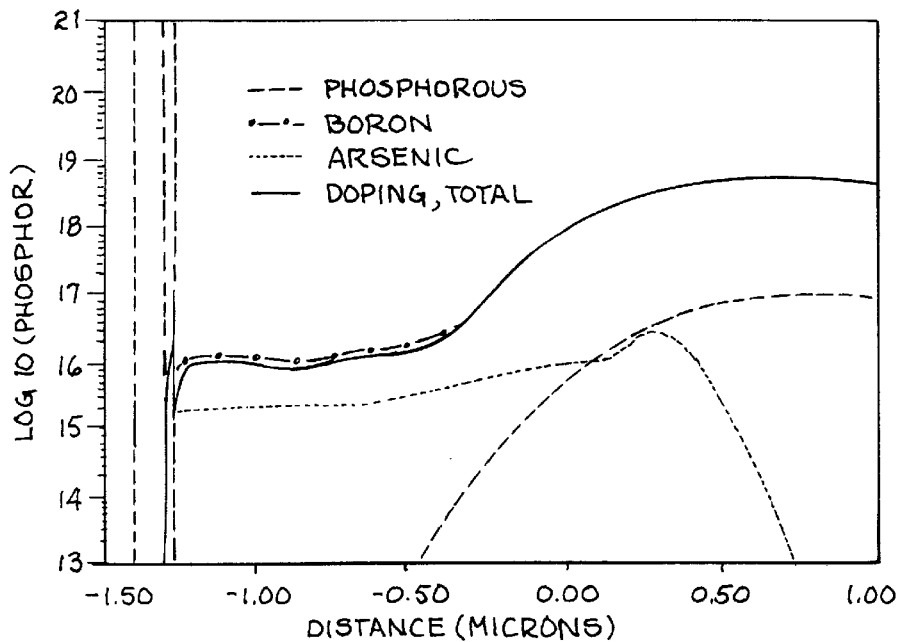
FIG. 5 is a doping profile of the collector region of a PNP transistor formed in an epitaxial region grown using the process of the present invention.

The basic epitaxial growth cycle of the present invention introduces an N type dopant (arsenic) into the $H_2$ high temperature bake cycle. Then an intrinsic epitaxial layer cap is deposited, followed with a high temperature purge and then completed with the final arsenic doped epitaxial layer deposition. This basic process suppresses the boron autodoping and at the same time tends to correct the NPN collector doping profile. The introduction of the N type dopant during the $H_2$ high temperature bake cycle proved to be very effective in correction of the NPN collector profile, as shown in FIG. 4, wherein the substantial dip 20 of prior art FIG. 1 has been corrected.

The process offers very good control over the dopant level at the bottom of the NPN collector. The epitaxial high temperature bake cycle of the present invention improves the NPN collector N type dopant concentration profile; this occurs without adversely affecting the P type dopant concentration profile of the PNP collectors. The described process also has a benefit in improving the PNP collector profile, especially when heavier N type compensation is required.

Figure 3:
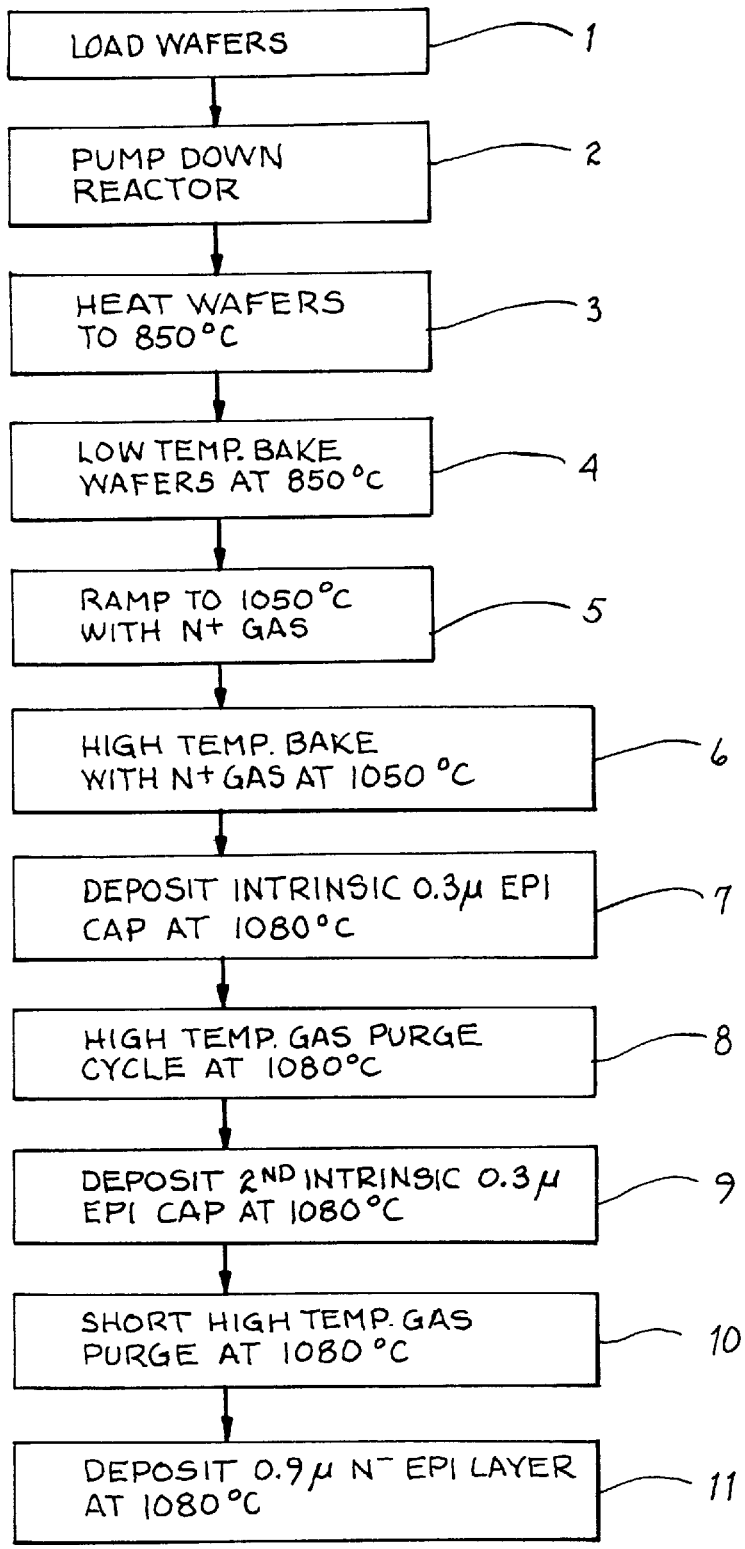
FIG. 3 is a flow chart useful in describing the process of the present invention.

In the process flow chart of FIG. 3, blocks 1–4 of the illustrated process refer to conventional steps for growth of a lightly doped N type epitaxial silicon layer on a lightly doped P type silicon substrate. The low temperature step of block 4 is performed at 850° C. for roughly 10 minutes, including ramp-up. Steps 5–11 of FIG. 3 are performed at high temperatures in the presence of hydrogen which is used as a carrier gas.

Figure 6:
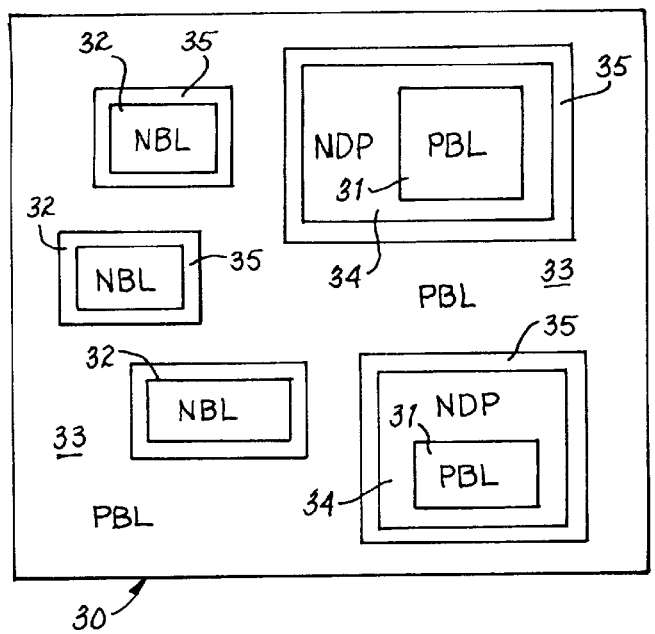
FIG. 6 is a plan view of a wafer showing locations of P+ and is N+ buried layer regions and the deep N+ regions.

Referring to FIGS. 3 and 6, note that the wafers referred to in block 1 include the numerous P+ buried layers 31 for the collectors of PNP transistors to be formed, N+ buried layers 32 of NPN transistors to be formed, and the "field" P+ region 33 such that the large (e.g., approximately 80%) of the surface area of each wafer contains a heavy concentration of P+ (boron) dopant atoms. FIG. 6 shows a single chip 30 of one of the silicon wafers. A number of P+ buried layers 31 and N+ buried layers 32 are formed in the P– substrate, as shown. An N+ "ring" 32 around each N– well 34 and P+ buried layer 31 therein as it appears in FIG. 6 is formed by a "deep N+" regions 34 in which the P+ buried layer is found. Each of the N type layers 32 and 34 is surrounded by a "ring" 35 of P– substrate material between that layer and the P+ layer 33.

Figure 7:
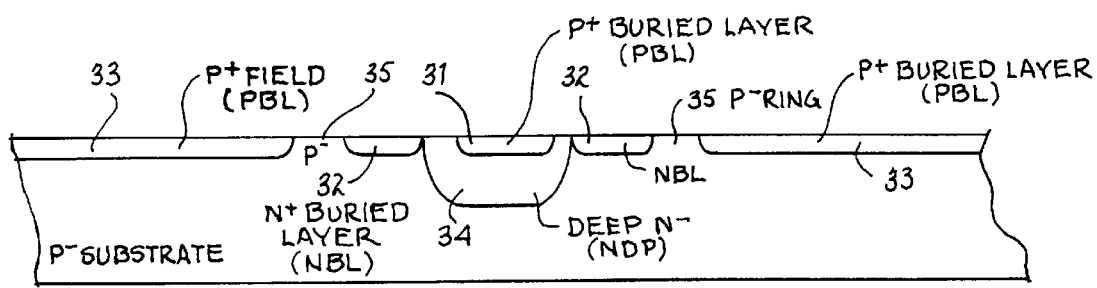
FIG. 7 is a partial section view of a wafer illustrating the structure of a chip manufactured using the complementary bipolar/CMOS process of the present invention.

FIG. 7 shows a cross sectional area of a portion of the wafer 30 before the beginning of the process of FIG. 3. Deep N+ regions 34 and P– rings 35 separate and electrically isolate each P+ buried layer 31 from the rest of the P+ layer 33 of chip 30, which includes diffused P+material identical to that of the P+ buried layers 31.

That means that when the wafers are raised to the processing temperatures of 1050° C. to 1080° C. shown in FIG. 3, many boron atoms escape from the large P+ surface area 33 of the wafer into the $H_2$ carrier gas and then act as a P+ dopant gas so as to "auto-dope" the N type epitaxial layer being grown, unless something is done to prevent that from occurring. If not for the present invention, the resulting decrease or dip in the collector dopant concentration profiles would increase the resistivities of the collector regions of the NPN transistors subsequently formed over the N+ buried layer regions, making them slower and causing the other above mentioned performance degradation.

The combination of steps indicated in blocks 5–9 of FIG. 3 is new in an epitaxial silicon growth process. Specifically, the step of block 5, to include N+ type dopant (arsenic) molecules in the $H_2$ carrier gas during such a heating step in an epitaxial growth process is novel, and is necessary to counteract the escaped "P+" boron atoms involved in the autodoping.

Although it is conventional to perform the high temperature bake step of a prior art epitaxial silicon growth process in the presence of hydrogen at high temperature, it is novel to include N+ dopant molecules in the hydrogen carrier gas during such high temperature bake step as indicated in block 6. This high temperature bake step is performed at 1050° C. for two minutes. In blocks 5 and 6 the amount of N+ dopant gas injected is approximately 280 sccm (standard cubic centimeters per minute) in a total $H_2$ flow of 280 slm (standard liters per minute).

Figure 8:
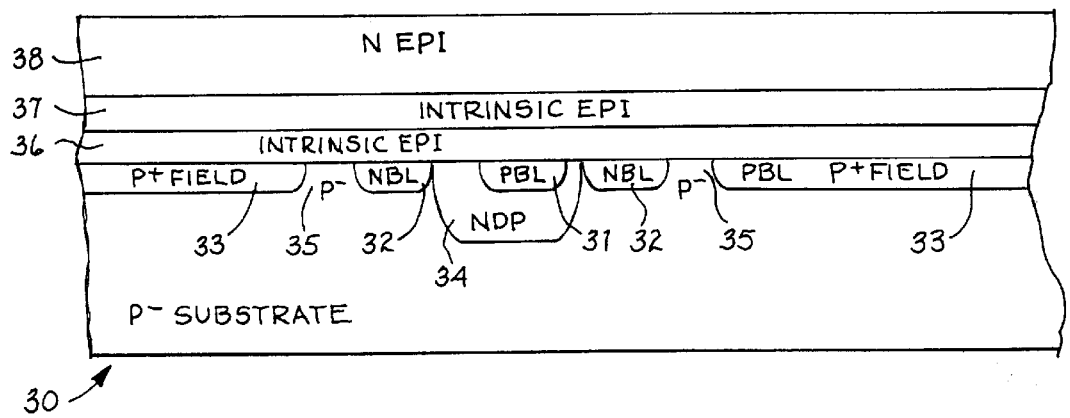
FIG. 8 is a partial section view of the wafer shown in FIG. 7 after deposition of the two intrinsic epi layers and a lightly doped N type epi layer in accordance with the invention.

As indicated in block 7 of FIG. 3, a very thin 0.3 micron layer or "cap" layer 36 of intrinsic, i.e., undoped, epitaxial silicon, shown in FIG. 8, is deposited over the entire surface of the wafer to form a "seal" or cap over the large percentage of the wafer which has P+ "field" diffusion and P+ buried layers therein. This intrinsic "cap" layer 36 prevents the above mentioned P+ boron atoms from escaping from the large P+ area into the hydrogen carrier gas. Intrinsic cap layer 36 also inhibits P+ boron atoms in the carrier gas form entering the N+ buried layers 32. Thus, the intrinsic cap layer 36 inhibits above mentioned P type "auto-doping" that reduces N type dopant concentration in the collectors of the subsequently formed NPN transistors and reduces their operating speeds.

Figure 2:
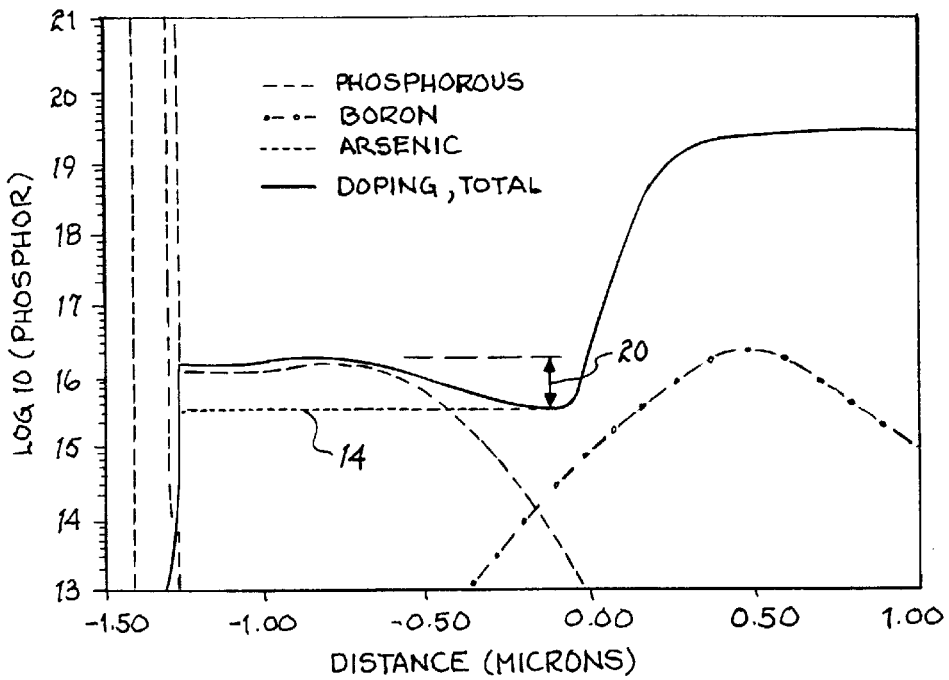
FIG. 2 is a doping profile of the collector region of an NPN transistor fabricated using the standard prior art epitaxial process.

Block 8 refers to a high temperature gas purge cycle at 1080° C. for approximately 5–10 minutes, depending on the ratio of P+ field area 33 to the total wafer area to cause redistribution of the dopant molecules in the wafer in accordance with the above mentioned ratio of the P+ field diffusion area to the "non-P+" area. The high temperature gas purge cycle of block 8 also causes outgassing of arsenic molecules previously diffused during the high temperature bake cycle of blocks 5 and 6 into the susceptor (on which the substrates are supported) and into other surfaces of the inside of the reactor. The high temperature gas purge cycle of block 8 prevents these outgassed N type dopant molecules from doping the next intrinsic cap layer 37, shown in FIG. 8, deposited according to block 9 of FIG. 3, and was found to be necessary to achieve the desired NPN collector dopant concentration profile without a substantial dip 20 (FIG. 2).

The second high temperature gas purge cycle at 1080° C. indicated in block 10 is not nearly as critical as the first high temperature gas purge cycle of block 8, because the first high temperature gas purge cycle eliminates a majority of the dopant molecules that otherwise would enter the carrier gas from the various inner surfaces of the reactor and susceptor and then reenter the wafer surface and therefore affect the dopant concentration profiles of the NPN and PNP transistors.

The main reason for depositing the second intrinsic cap layer 37 according to block 9 is to provide a "sharper" transition in the dopant concentration profile than would be achieved if only a single intrinsic cap layer were provided. The elimination of the undesired autodoping species by the first high temperature gas purge cycle of block 8 is what makes it possible for the second intrinsic cap layer 37 to continue the initial sharp transition that would be made into a more gradual transition if the extraneous dopant species from the inner surfaces of the reactor were not first removed.

Block 9 of FIG. 3 illustrates the growth of the abovementioned second intrinsic 0.3 micron cap layer 37 of undoped epitaxial silicon at 1080° C. on top of the first 0.3 micron intrinsic layer 36 grown in step 7. Second cap layer 37 further helps to prevent undesired P type and N type auto-doping. Then, after a short, high temperature bake process at 1080° C. for 1 minute as indicated in block 10, a conventional 0.9 micron N– epitaxial deposition of silicon layer 38, shown in FIG. 8, is formed on the top of the second intrinsic cap at 1080° C., as indicated in block 11. The total thickness of the composite epitaxial silicon layer 36,37,38 formed on the wafer substrate therefore is 0.3+0.3+0.9=1.5 microns.

In accordance with the present invention, the presence of the N+ dopant during the steps of blocks 5 and 6 provides enough N+ atoms which, during the growth of the first and second intrinsic epitaxial layers 36 and 37, respectively, of FIG. 8 provides a graded increase in the N type concentration at the bottoms of the NPN collector regions to compensate for a decrease in N type concentration in the region which the implanted N type dopant ions failed to reach. This reduces the collector resistance, increasing the cutoff frequency $f_T$.

It should be appreciated that those skilled in the art know that even if the ratio of area of P+ "field" diffusion and P+ buried layer area on the surface of a wafer to the total area of the wafer amount both the P+ is substantially less than the 80% ratio in the above described example, a serious P+ autodoping problem nevertheless will exist and need to be compensated according to the present invention. If a higher number or "density" of transistors in the wafer surface is increased, the ratio of the P+ "field" area 33 to the total wafer area may decrease to values far lower than 80%. Nevertheless, a sufficient number of P+ atoms may escape and cause autodoping that, without the present invention, result in a significant dip in the N type dopant concentration profile at the "bottoms" of the NPN collector regions. Therefore, the high temperature bake cycle in the presence of N+ dopant to compensate such P+ autodoping and at least one, and preferably two, intrinsic epi cap layers will suppress the P– autodoping as described herein.

Note that the high temperature gas purge cycle of block 8 can be used to "fine tune" the shape of the N type dopant concentration profile for the NPN transistors as a function of the above-mentioned ratio of the P+ "field" diffusion area 33 to the total area of the wafer surface in which the integrated circuit is formed by adjusting the duration and temperature of the temperature of that high temperature bake cycle.

As a result of the foregoing process, doping profiles shown in FIG. 4 for the collectors of NPN transistors formed in the 1.5 micron epitaxial layer are achieved. This doping profile avoids the "dip" 20 in the N type dopant concentration shown in prior art FIG. 2 representing the previously described undesirably low concentration of N type impurities at the bottoms of the NPN collector regions.

Thus, the invention provides an epitaxial process engineered specifically to (1) reduce the boron autodoping effect and (2) correct the differences in profiles of the PNP and NPN collector regions. Thin, intrinsic epitaxial layers are formed on a lightly doped P type silicon substrate having a large percentage of its surface area occupied by P+ regions, and a smaller percentage by N+ regions, for the purpose of preventing outgassing of P type impurity atoms during growth of an epitaxial N– layer and preventing such P type atoms from auto-doping the bottom portions of the N– Epitaxial layers above N+ buried layer regions formed in the substrate.

By way of definition, the term "intrinsicly-formed" is used to refer to an epitaxial layer that is formed without dopant being introduced from an external or outside source into the reactant gas, even though dopant impurities are formed in the "intrinsicly-formed" epitaxial layers because such dopant impurities are introduced into the reactant gas from ambient internal sources. Such ambient internal sources include autodoping from heavily doped regions formed earlier in the substrate and also include N+ atoms introduced into surfaces of the system earlier during the temperature ramp up of block 5 of FIG. 3 in the presence of N+ gas and the high temperature bake of block 6 of FIG. 3 in the presence of N+ gas.

Appendix 1, attached hereto and incorporated herein, is a copy of a related unpublished paper by the inventors to be publicly presented by the inventors approximately Sep. 20, 1998.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

What is claimed is:

1. A method of making an epitaxial layer on a silicon substrate having in a major surface thereof a P+ field layer region in a substantial portion of the major surface, comprising:

(a) loading the substrate in a reactor and providing a carrier gas therein;

(b) performing a low temperature bake cycle on the substrate at a temperature of approximately 850° C.;

(c) further heating the substrate while providing N+ dopant gas in the carrier gas;

(d) performing a high temperature bake cycle on the substrate in the presence of N+ dopant gas;

(e) depositing a first intrinsic epitaxial cap layer on the substrate;

(f) performing a first high temperature gas purge cycle;

(g) depositing a second intrinsic epitaxial cap layer on the first intrinsic epitaxial cap layer;

(h) performing a second high temperature gas purge cycle; and (i) depositing an N– epitaxial layer having a thickness substantially greater than the thickness of either of the first and second intrinsic cap layers on the second intrinsic epitaxial cap layer.

2. The method of claim 1 wherein step (c) includes ramping the temperature of the substrate up to approximately 1050° C.

3. The method of claim 1 wherein step (e) includes depositing the first intrinsic epitaxial cap layer with a thickness of approximately 0.3 microns.

4. The method of claim 3 wherein step (g) includes depositing the second intrinsic epitaxial cap layer with a thickness of approximately 0.3 microns.

5. The method of claim 4 wherein step (i) includes depositing the N– epitaxial layer with a thickness of approximately 0.9 microns.

6. The method of claim 1 including performing an N type ion implantation in the N– epitaxial layer to increase the conductivity thereof, the implantation dopant concentration causing a reduction of a dip in the N type dopant concentration in the N× epitaxial layer at a depth beyond the implant depth, the method including providing the N+ dopant gas in steps (c) and (d) in sufficient amounts to provide enough N type dopant ions to create a graded increase in the first and second intrinsic epitaxial cap layers and the N– epitaxial layer to at least partially compensate the dip.

7. A method of making an epitaxial layer on a P type silicon substrate having in a major surface thereof a plurality of P+ buried layer regions, a plurality of N+ buried layer regions, and also having a P+ field layer region in most of the major surface, comprising:
   (a) loading the substrate in a reactor and providing a carrier gas therein;
   (b) performing a low temperature bake cycle on the substrate at a first temperature;
   (c) heating the substrate to a second temperature substantially higher than first temperature while providing N+ dopant gas with the carrier gas;
   (d) performing a high temperature bake cycle on the substrate in the presence of the N+ dopant gas at the second temperature;
   (e) depositing an intrinsic first epitaxial cap on the substrate;
   (f) performing a first high temperature gas purge (cycle at a temperature approximately equal to the second temperature;
   (g) depositing an intrinsic second epitaxial cap layer on the first intrinsic epitaxial cap layer; and
   (h) depositing an N− epitaxial layer and having a thickness substantially greater than the thickness of either of the intrinsic first and second epitaxial cap layers.

8. The method of claim 7 including performing a second high temperature gas purge after step (g), wherein the temperature of the first high temperature gas purge cycle is higher than the temperature of the second high temperature gas purge cycle.

9. The method of claim 7 including performing a second high temperature bake cycle at a temperature approximately equal to the second temperature between steps (g) and (h).

10. A method of making an epitaxial layer on a substrate having in a major surface thereof a P+ field layer region in a substantial portion of the major surface, comprising:
    (a) loading the substrate in a reactor and providing a carrier gas therein;
    (b) heating the substrate while providing N+ dopant gas with the carrier gas;
    (c) performing a high temperature bake cycle on the substrate in the presence of N+ dopant gas;
    (d) depositing a first intrinsic epitaxial cap layer on the substrate;
    (e) performing a first high temperature gas purge cycle; and
    (f) depositing an N− epitaxial layer having a thickness substantially greater than the thickness of the first intrinsic cap layer on the substrate.

11. The method of claim 10 including depositing a second intrinsic epitaxial cap layer on the first intrinsic epitaxial cap layer, and performing a second high temperature gas purge cycle, wherein step (f) includes depositing the N− epitaxial layer on the second intrinsic cap layer.

12. The method of claim 10 wherein step (b) includes ramping the temperature of the substrate up to approximately 1050° C.

13. The method of claim 10 including performing an N type ion implantation in the N− epitaxial layer to increase the conductivity thereof, the implantation dopant concentration causing reduction, portion of a dip in the N type dopant concentration in the N− epitaxial layer at a depth beyond the implant depth, the method including providing the N+ dopant gas in steps (b) and (c) in sufficient amounts to provide enough N type dopant ions to create a graded increase in the first and second intrinsic epitaxial cap layers and the N− epitaxial layer to at least partially compensate the dip.

14. A method of making an epitaxial layer on a substrate having in a major surface thereof a P+ field layer region in a substantial portion of the major surface, comprising:
    (a) loading the substrate in a reactor and providing a carrier gas therein;
    (b) performing a high temperature bake cycle on the substrate in the presence of N+ dopant gas;
    (c) depositing a first intrinsic epitaxial cap layer on the substrate;
    (d) performing a first high temperature gas purge cycle; and
    (e) depositing an N− epitaxial layer having a thickness substantially greater than the thickness of the first intrinsic cap layer on the substrate.

* * * * *